(12) United States Patent
Cheng et al.

(10) Patent No.: US 6,960,512 B2
(45) Date of Patent: Nov. 1, 2005

(54) METHOD FOR MANUFACTURING A SEMICONDUCTOR DEVICE HAVING AN IMPROVED DISPOSABLE SPACER

(75) Inventors: Shui-Ming Cheng, Hsin-Chu (TW); Ka-Hing Fung, Hsin-Chu (TW); Yin-Pin Wang, Kaohsiung (TW); Kuan-Lun Cheng, Hsin-Chu (TW); Huan-Tsung Huang, Hsin-Chu (TW)

(73) Assignee: Taiwain Semiconductor Manufacturing Company, Ltd., Hsin-Chu (TW)

( * ) Notice: Subject to any disclaimer, the term of this patent is extended or adjusted under 35 U.S.C. 154(b) by 60 days.

(21) Appl. No.: 10/602,241

(22) Filed: Jun. 24, 2003

(65) Prior Publication Data
US 2004/0266122 A1 Dec. 30, 2004

(51) Int. Cl.$^7$ .................. H01L 21/336; H01L 21/8238
(52) U.S. Cl. ........................ 438/305; 438/303; 438/229
(58) Field of Search ................................ 438/305, 229, 438/230, 231, 232, 301, 303, 306

(56) References Cited

U.S. PATENT DOCUMENTS 5,949,105 A * 9/1999 Moslehi .................. 257/336
6,258,680 B1 * 7/2001 Fulford et al. ............ 438/305

* cited by examiner

Primary Examiner—Walter L. Lindsay, Jr.
(74) Attorney, Agent, or Firm—Slater & Matsil, L.L.P.

(57) ABSTRACT

The present invention provides methods for manufacturing semiconductor devices. In one embodiment, the method includes forming a gate oxide over a substrate and a gate electrode over the gate oxide. The method also includes implanting impurities into the substrate using the gate electrode as an implant mask to form lightly-doped regions in the substrate. The method further includes forming a first spacer adjacent the gate electrode, and implanting impurities into the substrate and through a portion of the lightly-doped regions using the first spacer as an implant mask to form deep source/drain regions in the substrate. The method still further includes forming a second spacer adjacent the first spacer, implanting impurities into the substrate using the second spacer as an implant mask to form a graded source/drain region in the substrate, and removing the second spacer. Also disclosed is a semiconductor device constructed using the techniques disclosed herein.

21 Claims, 2 Drawing Sheets

US 6,960,512 B2

METHOD FOR MANUFACTURING A SEMICONDUCTOR DEVICE HAVING AN IMPROVED DISPOSABLE SPACER

TECHNICAL FIELD OF THE INVENTION

This disclosure relates, in general, to semiconductor processes, and more specifically to methods of manufacturing a semiconductor device having improved junction capacitance, junction impedance, channel carrier mobility and other short channel effects.

BACKGROUND OF THE INVENTION

The manufacture of integrated circuits on semiconductor wafers has continued to allow electrical devices to become more compact, yet with improved performance and greater capabilities. As a result, manufacturers are constantly improving on the manufacturing techniques and processes for the semiconductor devices forming these integrated circuits. In particular, silicon-on-insulator (SOI) technology is becoming an increasingly important field in the manufacture of integrated circuits. SOI technology deals with forming semiconductor devices, such as transistors, in a layer of semiconductor material overlying an insulating layer. The insulating layer is formed on an underlying substrate of a semiconductor wafer and electrically isolates the devices from other areas and devices of the integrated circuit. Electrical interconnects are then formed throughout the various layers of the wafer to interconnect the different devices to form the circuit.

Typically, such transistors include graded junction regions implanted into the semiconductor material on either side of a gate structure, and usually include HALO pockets, deep source/drain regions, graded source/drain regions, and lightly-doped drain (LDD) regions. The gate structure is formed on the surface of the semiconductor material, over a channel generally defined between the graded junction regions, which are typically formed deep into the semiconductor material and reach the insulating layer. To manufacture such devices, conventional processes form spacers adjacent the gate structure, and then perform an implant to form heavy-doped graded source/drain regions alongside the channel, yet still relatively far away from it. The spacers are then removed and more spacers are formed, yet smaller in width, to dope the deep source/drain regions closer to the channel. LDDs, closest to the channel, are then formed resulting in graded junctions on either side of the channel. Throughout this process, light doping is usually used to specifically engineer the junction capacitance (Cj) of the graded junctions in an attempt to optimize device performance. While such problems may be avoided in SOI devices by simply omitting the graded implantation (since the Cj of SOI devices is small when compared to bulk device due to the insulating layer in SOI devices), the problems are exacerbated in bulk devices where the graded source/drain implants are needed to reduce the Cj and improve device performance.

Unfortunately, among the many problems that result from such conventional manufacturing processes, employing smaller spacers during the process usually requires a corresponding change in doping profile (e.g., lowering the dopant energy at each implant), often resulting in a penalty in the final Cj of the device. In addition, the material used to form the smaller spacers, typically nitride, often detrimentally affects the formation of acutely graded junctions in the device tubs, which is critical to optimizing device performance. Specifically, attempting to implant dopant through a nitride layer often detrimentally affects the accuracy in forming the graded junctions typically desired. Still further, the high temperature to which the wafer is typically subjected during the formation of spacers often causes unwanted diffusion of dopants implanted into the substrate. Accordingly, what is needed in the art is a method for manufacturing semiconducter devices that does not suffer from the deficiencies of conventional techniques, and that can be employed with both bulk devices and ultra-thin manufacturing techniques, such as ultra-thin SOI manufacturing.

SUMMARY OF THE INVENTION

To address the above-discussed deficiencies of the prior art, the present invention provides, in one aspect, a method of manufacturing a semiconductor device. In one embodiment, the method includes forming a gate oxide over a substrate and a gate electrode over the gate oxide. The method also includes implanting impurities into the substrate using the gate electrode as an implant mask to form lightly-doped regions in the substrate. The method further includes forming a first spacer adjacent the gate electrode and implanting impurities into the substrate and through a portion of the lightly-doped regions using the first spacer as an implant mask to form deep source/drain regions in the substrate. The method still further includes forming a second spacer adjacent the first spacer, implanting impurities into the substrate using the second spacer as an implant mask to form a graded source/drain region in the substrate, and then removing the second spacer.

In another aspect, the present invention provides another embodiment of a method of manufacturing a semiconductor device. In this embodiment, the method includes forming a gate oxide over a substrate and a gate electrode over the gate oxide. The method also includes implanting impurities into the substrate using the gate electrode as an implant mask to form lightly-doped regions in the substrate. Also, the method includes forming a first spacer adjacent the gate electrode and forming a second spacer adjacent the first spacer. The method further includes implanting impurities into the substrate using the second spacer as an implant mask to form a graded source/drain region in the substrate, and then removing the second spacer. The method still further includes implanting impurities into the substrate and through a portion of the lightly-doped regions using the first spacer as an implant mask to form deep source/drain regions in the substrate.

In yet another aspect, the present invention provides a semiconductor device. In such an embodiment, the semiconductor device comprises a gate structure formed over a semiconductor region, a sidewall spacer formed along a sidewall of the gate structure, and a disposable spacer formed along an outer edge of the sidewall spacer. The device also includes a lightly-doped region formed in the semiconductor region to a first depth, where the lightly-doped region is substantially aligned with the sidewall of the gate structure. The device further includes a deep source/drain region formed in the semiconductor region to a second depth deeper than the first depth, where the deep source/drain region is substantially aligned with an outer edge of the sidewall spacer. The device still further includes a graded source/drain region formed in the semiconductor region to a third depth deeper than the second depth, where the graded source/drain region is substantially aligned with an outer edge of the disposable spacer.

The foregoing has outlined preferred and alternative features of the disclosed process so that those skilled in the art may better understand the detailed description that follows. Those skilled in the art should appreciate that they can readily use the disclosed conception and specific embodiments as a basis for designing or modifying other structures for carrying out the same purposes. Those skilled in the art should also realize that such equivalent constructions do not depart from the spirit and scope of the issued claims and their equivalents.

BRIEF DESCRIPTION OF THE DRAWINGS

For a more complete understanding, reference is now made to the following detailed description taken in conjunction with the accompanying drawings. It is emphasized that various features may not be drawn to scale. In fact, the dimensions of various features may be arbitrarily increased or reduced for clarity of discussion. In addition, it is emphasized that some components may not be illustrated for clarity of discussion. Reference is now made to the following descriptions taken in conjunction with the accompanying drawings, in which.

DETAILED DESCRIPTION OF ILLUSTRATIVE EMBODIMENTS

In the following discussion, numerous specific details are set forth to provide a thorough understanding of the disclosure. However, those skilled in the art will appreciate that the techniques herein may be practiced without such specific details. In other instances, well-known elements have been illustrated in schematic or block diagram form in order not to obscure the disclosure in unnecessary detail. Additionally, some details have been omitted inasmuch as such details are not considered necessary to obtain a complete understanding of the disclosure, and are considered to be within the understanding of persons of ordinary skill in the relevant field of art.

Figure 1:
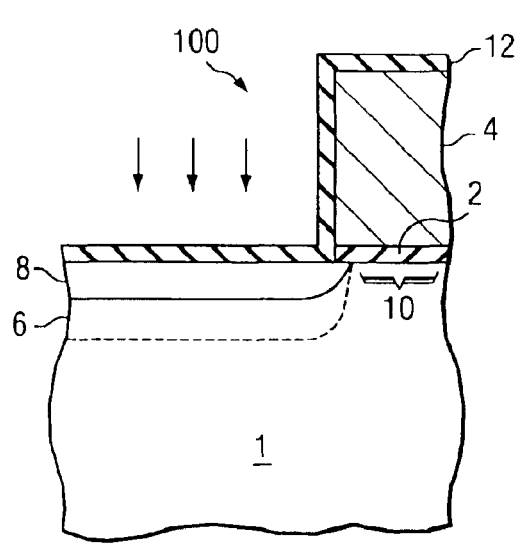
FIG. 1 illustrates an exemplary semiconductor device constructed according to one embodiment of a process disclosed herein during early stages of the disclosed manufacturing process.

Referring initially to FIG. 1, illustrated is a semiconductor device 100 constructed according to one embodiment of a process disclosed herein. The semiconductor device 100 is illustrated during an initial stage of the novel manufacturing process. In one embodiment, the semiconductor device 100 will be a metal-oxide-semiconductor field effect transistor (MOSFET). However, the disclosed manufacturing process is not limited to constructing a MOSFET, and any useful semiconductor device may be constructed.

As shown, a gate oxide 2 has been formed over the surface of a substrate 1. In an advantageous embodiment, the substrate 1 is a semiconductor material, and in a more specific embodiment, the substrate 1 is silicon-on-insulator (SOI) constructed according to conventional techniques. Of course, the substrate 1 may be constructed of any beneficial material useful in constructing semiconductor devices. Moreover, the gate oxide 2 may preferably be a low temperature oxide, such as TEOS, formed using conventional techniques, such as chemical vapor deposition (CVD), although other deposition techniques are within the scope of the present invention.

Also as illustrated in FIG. 1, a gate electrode 4 is formed over the gate oxide 2. In one embodiment, the gate electrode 4 is formed using a blanket deposit of an appropriate material, which is then etched to form the gate electrode 4. In a specific embodiment, the gate electrode 4 is formed from polysilicon, however any appropriate material may be employed in the manufacture of the semiconductor device 100. Furthermore, the gate electrode 4 may also be formed using any appropriate technique, either now existing or later developed.

During the next step in the process, an implant is performed over the gate electrode 4 and into the substrate 1. More specifically, the implant performed is a HALO implant, and is performed to create a HALO pocket 6 below the surface of the substrate 1. Once the HALO pocket 6 is created, another implant is performed into the substrate 1 that results in a lightly-doped region (LDD) 8 formed beneath the surface of the substrate 1. Both of these implants are performed using the gate electrode 4 as a mask, masking off an area of the substrate 1 intended to be substantially protected during the different implantation processes. As illustrated, although the gate electrode 4 serves as a mask during the implanting of the HALO pocket 6 and the LDD 8, the dopant implanted into the substrate 1 may still seep slightly under the gate oxide 2 and gate electrode 4, which is often desirable in the manufacturing of semiconductor devices. In other words, although the dopant is implanted so as to be aligned to the implant mask, subsequent diffusion will cause migration of the dopant outside the mask pattern. In the resulting structure, the dopant profile will nonetheless be substantially aligned to the implant mask, in this case the gate electrode 4. To perform the implant and form the LDD 8, a dopant concentration in the range of about 1E18 $cm^3$ to about 1E22 $cm^3$ may be employed. Those who are skilled in the pertinent field of art will understand the various process parameters that may be employed when performing such implants, and any such parameters may be employed with the disclosed process.

After the LDD 8 has been formed in the substrate 1, a channel region 10 is defined between LDDs 8 on either side of the gate structure (only the LDD on the left side of the device 100 is illustrated) and directly beneath the gate oxide 2. Specifically, the dopant selected for implanting and forming the LDD 8 is selected to provide a polarity opposite to the polarity of the tub of the substrate 1 in which the HALO pocket 6 and the LDD 8 are formed. As a result, the channel region 10 is nonconductive between the LDDs 8 until a charge is placed across the gate electrode 4. By activating the gate electrode 4, an inversion will occur in the channel region 10, inverting its polarity to that of the LDDs 8 to allow current to flow therethrough. For example, the dopant may be comprised substantially of arsenic or phosphorus if the semiconductor device 100 is intended to be an N-channel device, or substantially of boron if the semiconductor device 100 is intended to be a P-channel device. As with the process parameters discussed above, those who are skilled in the pertinent field of art will understand the various types of dopants that may be employed, and the resulting polarities associated with each, when performing such implants, and any such parameters may be employed with the disclosed process.

Next, a thin oxide layer 12 is deposited over the device 100. Specifically, the oxide layer 12 is formed over the gate electrode 4 and over the surface of the substrate 1. In one embodiment, the oxide layer 12 is also a low temperature oxide, such as TEOS, and is deposited using conventional techniques. As with the gate oxide 2, the oxide layer 12 may be formed using conventional techniques, such as a CVD process. In an alternative embodiment, the oxide layer 12 may be deposited before performing any implants into the substrate 1. In such an embodiment, the implants performed to create the HALO pocket 6 and the LDDs 8 will pass through the oxide layer 12 and into the substrate 1. Of course, the present invention is not limited to either technique.

Figure 2:
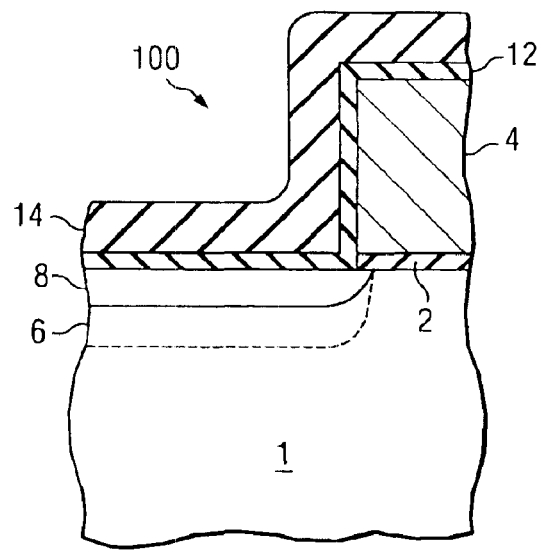
FIG. 2 illustrates the exemplary semiconductor device during a later stage in the disclosed process.

Turning now to FIG. 2, illustrated is the semiconductor device 100 of FIG. 1 during a later stage in the disclosed manufacturing process. More specifically, a nitride layer 14 is formed over the oxide layer 12. The nitride layer 14 may be silicon nitride, but other nitride-based materials may also be employed. Also, the nitride layer 14 may be formed using techniques, such as chemical vapor deposition (CVD), or any other appropriate technique. Layer 12 is preferably an oxide and layer 14 preferably a nitride, at least in part because of the etch selectivity between these materials. Other materials having similar etch selectivity and dielectric characteristics could also be employed.

Figure 3:
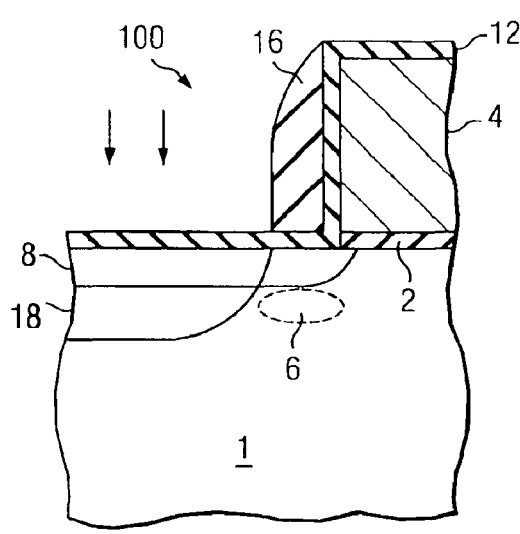
FIG. 3 illustrates the exemplary semiconductor device during another implant performed during the manufacturing process.

Looking now at FIG. 3, illustrated is the semiconductor device 100 discussed above during another implant performed during the manufacturing process. However, before this implant is performed, the nitride layer 14 is etched to form nitride spacers 16 adjacent the gate electrode 4. As may be seen, the new nitride spacers 16 are formed over portions of the LDD 8 that are closest to the gate electrode 4 and gate oxide 2. Once the nitride spacers 16 are formed, the implant is performed over the nitride spacers 16 such that the nitride spacers 16 are used as a mask during the implant. The implanted dopant passes through the oxide layer 12, and into the substrate 1. In an exemplary embodiment, this implant is performed using a dopant similar to the dopant employed to form the LDDs 8, but typically in a higher concentration, and results in the formation of deep source/drain regions 18 in the substrate 1. In one example, a dopant concentration in the range of about 1E20 $cm^3$ to about 1E22 $cm^3$ may be employed, and at higher implant energies. It should be noted that the term "source/drain region" will refer to a source region, a drain region, and both a source and a drain region, depending upon the context in which the term is used. It is generally intended that the term will be given its broadest interpretation for the context.

As with the implanting that formed the LDDs 8, the dopant in this implant also has some lateral diffusion, this time under a portion of the nitride spacers 16. However, as illustrated, any such diffusion of the dopant when forming the deep source/drain regions 18 does not reach too close to the channel region 10 defined by the ends of the LDDs 8. As a result, the tub in the substrate 1 maintains a graded dopant concentration when moving from the channel region 10 to either side of the tub. Those who are skilled in the art understand the importance of carefully engineering a graded channel/tub within a semiconductor device, such as the device 100 in FIG. 3, in order to optimize the performance of the device.

Figure 4:
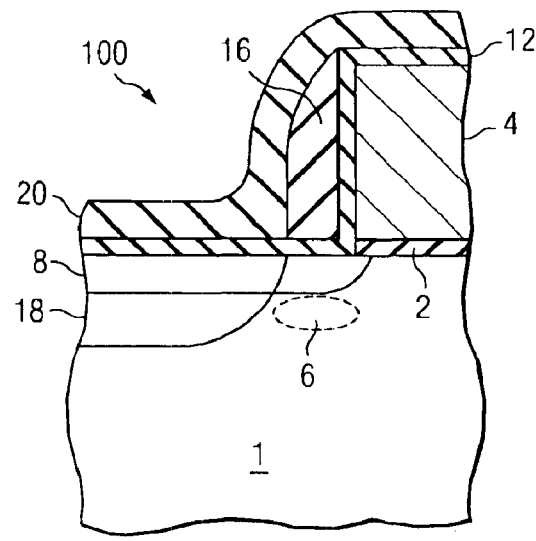
FIG. 4 illustrates the exemplary semiconductor device deeper into the manufacturing process.

Referring now to FIG. 4, illustrated is the semiconductor device 100 of FIGS. 1–3 deeper into the manufacturing process. As is shown, once the deep source/drain regions 18 are formed in the substrate 1, a thick oxide layer 20 is deposited over the gate electrode 4, the nitride spacers 16, and the thin oxide layer 12 formed over the surface of the substrate 1. Preferably, the oxide layer 20 is a low thermal budget oxide, such as a CVD formed TEOS layer. As used herein, the term "low thermal budget oxide" means oxides capable of being formed with a thermal budget of less than 600 C.

By forming the oxide layer 20 using a low thermal budget oxide, the ambient temperature of the entire semiconductor device 100 may be kept relatively low up to this stage of the manufacturing process. As a result, the low ambient temperature to which the device 100 is subjected helps reduce lateral diffusion of doped regions of the substrate 1, such as the LDDs 8, the HALO pocket 6, and the deep source/drain regions 18, into the channel region 10. Thus, by better controlling such lateral diffusion, more precise graded junctions, as well as channel region 10 width, may be manufactured, optimizing overall device performance and decreasing overall manufacturing costs. Moreover, such diffusion control becomes especially important as channel width is decreased in modern devices, a goal often sought in today's semiconductor market.

Figure 5:
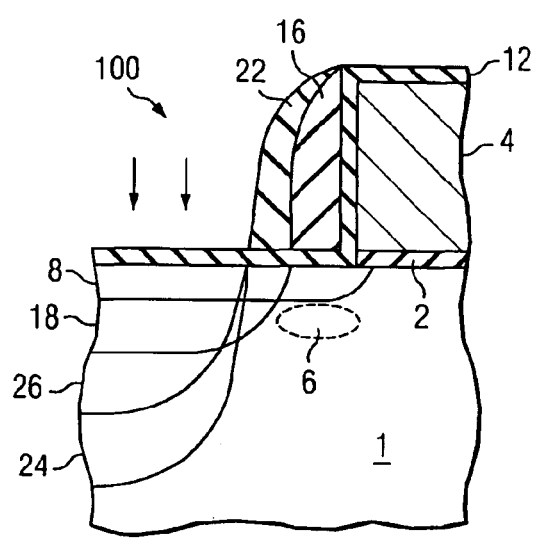
FIG. 5 illustrates the exemplary semiconductor device during another implant performed late in the manufacturing process.

Turning now to FIG. 5, illustrated is the semiconductor device 100 during another implant performed late in the manufacturing process. Specifically, the low thermal budget oxide layer 20 is first etched to form disposable spacers 22 adjacent and over the nitride spacers 16. To form the disposable spacers 22, conventional photolithography and etching techniques may be employed. Those who are skilled in the art understand the techniques available to etch a low thermal budget oxide layer 20 to form the disposable spacers 22, and the present invention is broad enough to encompass any such technique.

Once the disposable spacers 22 have been formed, another implant may then be performed, using the disposable spacers 22 as a mask for the implanted dopant. As is shown in the figures, the disposable spacers 22 have a width greater than that of the nitride spacers 16 employed during the implantation of the deep source/drain regions 18, since they are formed over the nitride spacers 16. As a result, the implant diffuses into a different region of the substrate 1, further from the channel region 10, forming graded source/drain regions 24. In addition, higher implant energies may be employed to form the graded source/drain regions 24 to a depth deeper than the depth of the deep source/drain regions 18.

In an exemplary embodiment, the implant used to form the graded source/drain regions 24 is performed using a dopant similar to the dopant employed to form the LDDs 8 and the deep source/drain regions 18. In a more specific embodiment, a dopant concentration in the range of about 1E15 $cm^3$ to about 1E18 $cm^3$ may be employed. Of course, other process parameters and dopants may also be employed to form the graded source/drain regions 24.

In addition, yet another implant may be performed, still using the disposable spacers 22 as a mask for the implant. This further implant may be employed to perform the gate doping 26 of the semiconductor device 100. Alternatively, this further implant may be skipped if the N-poly or P-poly pre-gate doping is performed first. A source/drain rapid thermal anneal (RTA) may then be performed to laterally diffuse the doped areas of the substrate 1 into final position with respect to the channel region 10. Those who are skilled in the art understand the techniques involved for performing an RTA of the semiconductor device 100, so those techniques will not be discussed here. After this final thermal cycle, the dopants in the various regions of this graded junction diffuse into their final locations, with respect to the channel region 10. With the width of the nitride spacers 16 less than that of the disposable oxide spacers 22, the dopant used to form the graded source/drain regions 24 diffuses to a final position further from the channel region 10 than did the dopant used to form the deep source/drain regions 18. As a result, the location of the deep source/drain regions 18 is closer to the channel region 10 than the graded source/drain regions 24, but not as close as the location of the LDDs 8. As a result, junctions having a defined graded layout may be formed in the semiconductor device 100, improving junction capacitance (Cj), as well as other short channel effects.

Figure 6:
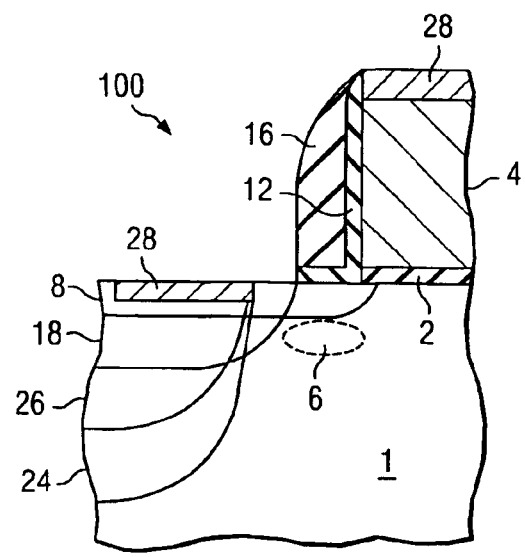
FIG. 6 illustrates the exemplary semiconductor device discussed above at the latter stage of manufacture.

Looking now at FIG. 6, illustrated is the semiconductor device 100 discussed above, at the latter stage of manufacture. As illustrated, the disposable spacers 22 have been removed from the semiconductor device 100. To remove the disposable spacers 22, in one embodiment, a dry/wet etch may be employed. Of course, any other appropriate technique may also be employed, and those who are skilled in the art understand the techniques that may be available to remove the disposable spacers 22. In addition, portions of the oxide layer 12 are also removed during the removal of the disposable oxide spacers 22, since, in an exemplary embodiment, both are composed of the same or similar material. The removal of certain portions of the oxide layer 12 exposes the surface of the substrate 1, for later use in the manufacture of the device 100.

Once the disposable spacers 22 have been removed, salicide contacts 28 may be formed proximate the surface of the substrate 1, and over the gate electrode 4. The salicide contacts 28 may be incorporated into the process to provide a better connection between the completed graded junctions (and gate electrode 4) of the device 100 and metal interconnects (not illustrated) used to electrically connect the device 100 to an operative circuit. Although not necessary to the practice of the disclosed process, the salicide contacts 28 may be formed by either directly depositing a salicide, such as titanium salicide or cobalt salicide or the like, or alternatively, by depositing a metal (e.g., titanium, tungsten, cobalt, nickel) and then forming the salicide in situ by the interaction of the metal and the underlying silicon.

In an alternative embodiment of the disclosed manufacturing process, the implant performed with reference to FIG. 3 to form the deep source/drain regions 18, may be performed along with the steps of the process discussed with reference to FIG. 6. In such an embodiment, the deep source/drain regions 18 may be formed through ion implantation after the implants used to form the graded source/drain regions 24 and the gate doping 26, and after the disposable spacers 22 have been removed. Afterwards, the salicide contacts 28 may then be formed, as discussed above. Of course, the present invention is not limited to either embodiment, and such an available option provides for greater flexibility in the manufacturing process than is typically available with conventional techniques.

It should be noted that the disclosed process described above is not limited to the specific steps set forth therein. Thus, a greater or lesser number of steps may be employed, and some steps, such as specific thermal cycles and wafer polishing, have been omitted for clarity of discussion since they are not deemed necessary to practice the present invention. However, those who are skilled in the art understand that such additional steps may be added without deviating from the scope of this disclosure. Additionally, steps having greater or lesser detail than those discussed herein may also be employed to advantage.

By employing the disclosed process, the deep source/drain regions 18, graded source/drain regions 24 and the LDDs 8 form a graded junction structure adjacent the channel region 10 providing for improved junction capacitance (Cj), as well as improving other short channel effects in the semiconductor device 100. In one example, the Cj may be in the range of about 0.1 fF/$\mu$m$^2$ to about 1 fF/$\mu$m$^2$. Moreover, the widths of the spacers 16, 22 employed in the disclosed processes may also be adjusted to fine-tune the graded layout of these junctions of the device 100 to any particular application. Adjusting the width of the disposable spacers 22 also provides the opportunity to minimize the distance from channel region 10 to the salicide contacts 28, improving overall device 100 performance by decreasing sheet resistance in the source/drain extensions, without the risk of leakage impairing device performance.

In addition, the present invention provides improved resistivity in the source/drain extension regions (i.e., junction impedance (Xj)) by employing the lower thermal budget spacers 16 and 22, thus providing more precision in the construction of the graded junctions in the device 100. Also, the carrier mobility in channel region 10 can be improved by constructing devices using a thicker contact etch stop layer with tensile or compressive film, deposited by a chemical vapor deposition (CVD) method to induce the higher stress in the channel region. Moreover, by forming the disposable spacers 22 after the nitride spacers 16 have been formed, the implants for forming the graded source/drain regions 24, the gate doping 26, and, optionally, the deep source/drain regions 18 need not be performed through a nitride layer. Those skilled in the art understand the difficulty involved in trying to form an acutely graded junction when passing an implant through nitride. Furthermore, the use of a low thermal budget oxide to form the disposable spacers 22 reduces the diffusion of implanted dopants during the manufacturing process, and prevents the implanted dopants from out-diffusing to the air from the substrate region. Finally, the process disclosed herein may be employed to manufacture any type of semiconductor device, including use in ultra-thin SOI processing, while retaining the benefits discussed above.

Figure 7:
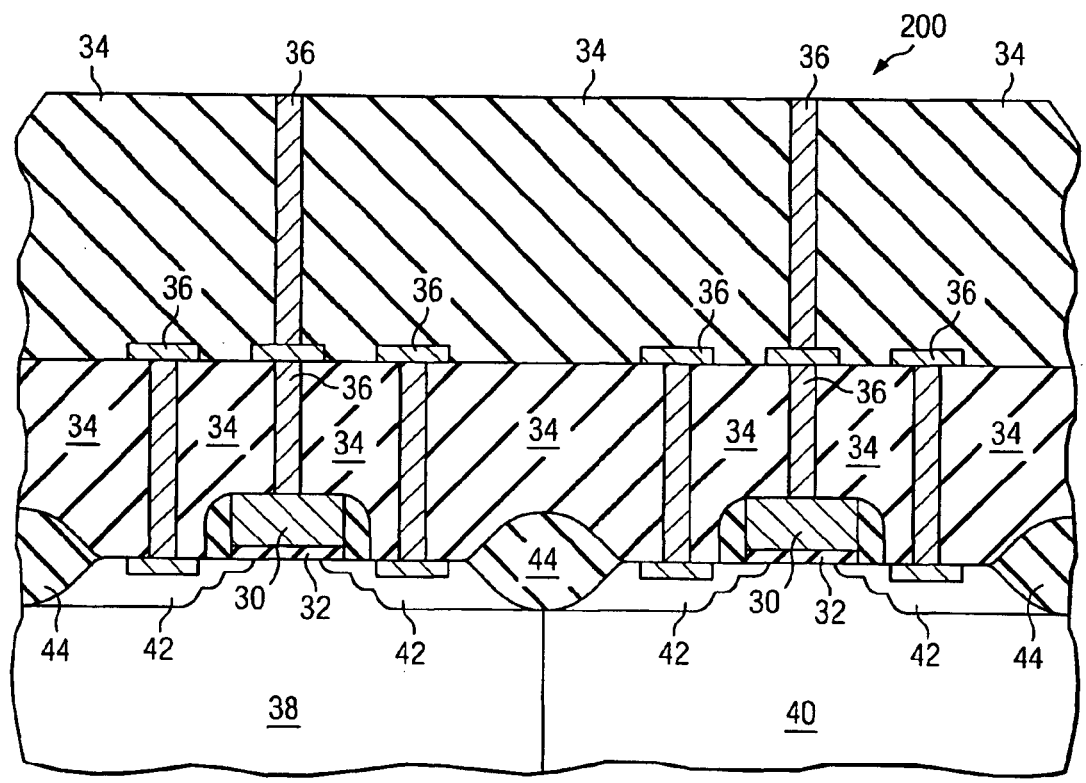
FIG. 7 illustrates a sectional view of an integrated circuit incorporating the manufacturing process disclosed herein.

Turning finally to FIG. 7, illustrated is a sectional view of an integrated circuit (IC) 200 incorporating the manufacturing process disclosed herein. The IC 200 may include active devices, such as transistors, used to form CMOS devices, BiCMOS devices, bipolar devices, or other types of active devices. The IC 200 may further include passive devices such as inductors or resistors, or it may also include optical devices or optoelectronic devices. Those skilled in the art are familiar with these various types of devices and their manufacture.

In the embodiment illustrated in FIG. 7, components of the IC 200 include transistors 30, having gate oxide layers 32, formed on a semiconductor wafer using the novel processes disclosed herein. The transistors 30 may be MOSFETs, however other types of transistors may also be manufactured. Interlevel dielectric layers 34 are then shown deposited over the transistors 30.

Interconnect structures 36 are formed in the interlevel dielectric layers 34 to form interconnections between the various components therein to form an operative integrated circuit. In addition, the interconnect structures 36 also connect the transistors 30 to other areas or components of the IC 200. Those skilled in the art understand how to connect these various devices together to form an operative integrated circuit. Also illustrated are conventionally formed tubs 38, 40 and field oxides 44, as well as the specific graded junction regions 42 manufactured according to the principles disclosed above.

Of course, use of the disclosed process is not limited to the manufacture of the particular components in the IC 200 illustrated in FIG. 7. In fact, the process is broad enough to encompass the manufacture of any type of component for use with an integrated circuit that would benefit from the advantages of the process discussed above. Beneficially, each time the method of the present invention is employed to form part or all of a semiconductor device in the IC 200, overall operation optimization may result due to, for example, the improved Cj and resistivity of the semiconductor devices, as well as other short channel effects.

Although the preferred embodiments have been described and illustrated by a symmetrical transistor in which the graded doped junctions are symmetric for both the source and drain, the present invention applies equally to an asymmetric device, such as for instance a device in which one of the source or drain has a graded doped junction. For instance, in some embodiments, the source region might be formed with only an LDD and source region, whereas the drain is formed with an LDD, a deep junction, and a drain region. As such, one or more of the above described spacers might be formed on only one side of the gate electrode. One skilled in the art will recognize the many permutations of spacers and dopant profiles, both symmetrical and asymmetrical, can be obtained through routine experimentation based upon the teaching provided herein.

Although the present invention has been described in detail, those skilled in the art should understand that they may make various changes, substitutions and alterations herein without departing from the spirit and scope of the invention in its broadest form. The particular embodiments disclosed above are illustrative only, as the invention may be modified and practice in different but equivalent manners apparent to those skilled in art having the benefit of the teachings herein. Further, no limitation are intended to the details of construction or designed herein shown, other than as described in the claims below. It is therefore evident that the particular embodiments disclosed above may be alter or modified and all such variations are considered within the scope and spirit of the invention. Accordingly, the protection sought herein is as set forth in the claims below.

What is claimed is:

1. A method of manufacturing a semiconductor device, comprising:
    forming a gate oxide over a substrate and a gate electrode over the gate oxide;
    implanting impurities into the substrate using the gate electrode as an implant mask to form lightly-doped regions in the substrate;
    forming a first spacer adjacent the gate electrode;
    implanting impurities into the substrate and through a portion of the lightly-doped regions using the first spacer as an implant mask to form deep source/drain regions in the substrate;
    forming a second spacer adjacent the first spacer, wherein the second spacer comprises a low thermal budget oxide formed with a thermal budget of less than 600 degrees Celsius;
    implanting impurities into the substrate using the second spacer as an implant mask to form a graded source/drain region in the substrate; and
    removing the second spacer.

2. The method as recited in claim 1, wherein said first spacer comprises a nitride.

3. The method as recited in claim 1, further including forming a salicide over the source/drain regions.

4. A method of manufacturing a semiconductor device, comprising:
    forming a gate oxide over a substrate and a gate electrode over the gate oxide;
    implanting impurities into the substrate using the gate electrode as an implant mask to form lightly-doped regions in the substrate;
    forming a first spacer adjacent the gate electrode;
    implanting impurities into the substrate and through a portion of the lightly-doped regions using the first spacer as an implant mask to form deep source/drain regions in the substrate;
    forming a second spacer adjacent the first spacer;
    implanting impurities into the substrate using the second spacer as an implant mask to form a grade source/drain region in the substrate;
    removing the second spacer;
    forming a dielectric over the gate electrode and the deep source/drain regions;
    forming a contact opening through said dielectric; and
    forming an interconnected in said contact opening, the interconnect being electrically coupled to the deep source/drain regions.

5. The method as recited in claim 4, wherein said second spacer comprises an oxide.

6. The method as recited in claim 5, wherein the second spacer is a low-temperature oxide having a thermal budget of less than 600C.

7. A method of manufacturing a semiconductor device, comprising:
    forming a gate oxide over a substrate and a gate electrode over the gate oxide;
    implanting impurities into the substrate using the gate electrode as an implant mask to form lightly-doped regions in the substrate;
    forming a first spacer adjacent the gate electrode;
    implanting impurities into the substrate and through a portion of the lightly-doped regions using the first spacer as an implant mask to form deep source/drain regions in the substrate;
    forming a second spacer adjacent the first spacer;
    implanting impurities into the substrate using the second spacer as an implant mask to form a graded source/drain region in the substrate;
    removing the second spacer; and
    depositing a nitride layer over the gate electrode and lightly-doped regions and forming the first spacer from the nitride layer, and further including depositing an oxide layer over the gate electrode and lightly-doped regions and forming the first spacer from the oxide layer.

8. A method of manufacturing a semiconductor device, comprising:
    forming a gate oxide over a substrate and a gate electrode over the gate oxide;
    implanting impurities into the substrate using the gate electrode as an implant mask to from lightly-doped region in the substrate;

forming a first spacer adjacent the gate electrode;

forming a second spacer adjacent the first spacer, wherein the second spacer comprises a low thermal budget oxide formed with a thermal budget of less than 600 degrees Celsius;

implanting impurities into the substrate using the second spacer as an implant mask to form a graded source/drain region in the substrate;

removing the second spacer; and implanting impurities into the substrate and through a portion of the lightly-doped regions using the first spacer as an implant mask to form deep source/drain regions in the substrate.

9. The method as recited in claim 8, wherein said first spacer comprises a nitride.

10. The method as recited in claim 8, further including forming a salicide over the source/drain regions.

11. A method of manufacturing a semiconductor device, comprising:

forming a gate oxide over a substrate and a gate electrode over the gate oxide;

implanting impurities into the substrate using the gate electrode as an implant mask to form lightly-doped regions in the substrate;

forming a first spacer adjacent the gate electrode;

forming a second spacer adjacent the first spacer;

implanting impurities into the substrate using the second spacer as an implant mask to form a graded source/drain region in the substrate;

removing the second spacer;

implanting impurities into the substrate and through a portion of the lightly-doped regions using the first spacer as an implant mask to form deep source/drain regions in the substrate; and depositing a nitride layer over the gate electrode and lightly-doped regions and forming the first spacer from the nitride layer, and further including depositing an oxide layer over the gate electrode and lightly-doped regions and forming the first spacer from the oxide layer.

12. The method as recited in claim 11, wherein said second spacer comprises an oxide.

13. The method as recited in claim 12, wherein the second spacer is a low-temperature oxide having a thermal budget of less than 600C.

14. A method of manufacturing a semiconductor device, comprising:

forming a gate oxide over a substrate and a gate electrode over the gate oxide;

implanting impurities into the substrate using the gate electrode as an implant mask to form lightly-doped regions in the substrate;

forming a first spacer adjacent the gate electrode;

forming a second spacer adjacent the first spacer;

implanting impurities into the substrate using the second spacer as an implant mask to form a graded source/drain region in the substrate;

removing the second spacer;

implanting impurities into the substrate and through a portion of the lightly-doped regions using the first spacer as an implant mask to form deep source/drain regions in the substrate;

forming a dielectric over the gate electrode and the source/drain regions;

forming a contact opening through said dielectric; and forming an interconnect in said contact opening, the interconnect being electrically coupled to said source/drain regions.

15. A method of manufacturing a semiconductor device, comprising:

forming a gate oxide over a substrate and a gate electrode over the gate oxide;

implanting impurities into the substrate using the gate electrode as an implant mask to form HALO pocket regions;

implanting impurities into the substrate using the gate electrode as an implant mask to form lightly-doped regions in the substrate, wherein at least part of the HALO pocket regions extend below the lightly-doped regions;

forming a first spacer adjacent the gate electrode;

implanting impurities into the substrate and through a portion of the lightly-doped regions using the first spacer as an implant mask to form deep source/drain regions in the substrate;

forming a second spacer adjacent the first spacer;

implanting impurities into the substrate using the second spacer as an implant mask to form a graded source/drain region in the substrate; and removing the second spacer.

16. The method as recited in claim 15, wherein the first spacer comprises a nitride.

17. The method as recited in claim 15, wherein the second spacer comprises an oxide.

18. The method as recited in claim 17, wherein the oxide of the second spacer is a low thermal budget oxide formed with a thermal budget of less than 600 degrees Celsius.

19. The method as recited in claim 15, further including depositing a nitride layer over the gate electrode and lightly-doped regions and forming the first spacer from the nitride layer, and further including depositing an oxide layer over the gate electrode and lightly-doped regions and forming the first spacer from the oxide layer.

20. The method as recited in claim 15, further including forming a salicide over the source/drain regions.

21. The method as recited in claim 15, further including:

forming a dielectric over the gate electrode and the deep source/drain regions;

forming a contact opening through the dielectric; and forming an interconnect in the contact opening, the interconnect being electrically coupled to the deep source/drain regions.

* * * * *

UNITED STATES PATENT AND TRADEMARK OFFICE
CERTIFICATE OF CORRECTION

PATENT NO. : 6,960,512 B2
DATED : November 1, 2005
INVENTOR(S) : Cheng et al.

It is certified that error appears in the above-identified patent and that said Letters Patent is hereby corrected as shown below:

Column 3,
Line 51, delete "inasmuch" and insert -- in as much --.

Column 10,
Line 21, delete "grade" and insert -- graded --.
Line 66, delete "from" and insert -- form --.

Signed and Sealed this

Twenty-fourth Day of January, 2006

JON W. DUDAS
*Director of the United States Patent and Trademark Office*